United States Patent
Yokotani et al.

Patent Number: 5,275,001
Date of Patent: Jan. 4, 1994

[54] THERMOELECTRIC COOLING DEVICE

[75] Inventors: Youichiro Yokotani, Suita; Kouichi Kugimiya, Osaka, both of Japan

[73] Assignee: Matsushita Electric Industrial Co., Ltd., Osaka, Japan

[21] Appl. No.: 943,488

[22] Filed: Sep. 11, 1992

[30] Foreign Application Priority Data

Oct. 7, 1991 [JP] Japan .................. 3-258900

[51] Int. Cl.$^5$ .................................. H01L 23/28
[52] U.S. Cl. ............................. 62/3.7; 136/239
[58] Field of Search ............... 62/3.1, 3.2, 3.7; 136/203, 224, 238, 239

[56] References Cited

U.S. PATENT DOCUMENTS

| | | | |
|---|---|---|---|
| 3,294,688 | 12/1966 | Precht | 136/238 |
| 3,615,870 | 10/1971 | Crouthamel | 136/204 |
| 3,775,843 | 12/1973 | Wendt | 264/61 X |
| 5,168,339 | 12/1992 | Yokotani et al. | 136/203 |

FOREIGN PATENT DOCUMENTS 1-231383  9/1989  Japan .
3-11672  1/1991  Japan .

OTHER PUBLICATIONS

Macklin et al., "On The Use of Oxides for Thermoelectric Refrigeration", Materials Science and Engineering B7(1990) 111-117.

Frederikse, et al., "Electronic Transport in Strontium Titanate", Physical Review, vol. 134, Number 2A, Apr. 20, 1964, pp. A442-A445.

Berglund, et al., "Electron Transport in Single-Domain, Ferroelectric Barium Titanate", Physical Review, vol. 157, Number 2, May 10, 1967, pp. 358-367.

*Primary Examiner*—Albert J. Makay
*Assistant Examiner*—William C. Doerrler
*Attorney, Agent, or Firm*—Fish & Richardson

[57] ABSTRACT

A thermoelectric semiconductor element is disclosed which is particularly low in toxicity and inexpensive. The element is mainly composed of a complex oxide comprising strontium and titanium. An oxide semiconductor possessing oxygen deficiency is used as the n-type element. According to the invention, as compared with a thermoelectric semiconductor element for thermoelectric cooling using a conventional Bi-Te thermoelectric semiconductor which is particularly toxic due to addition of Se or the like, the toxicity of the n-type semiconductor element part is lowered, and a thermoelectric semiconductor element excellent in performance is obtained.

7 Claims, 1 Drawing Sheet

THERMOELECTRIC COOLING DEVICE

FIELD OF THE PRESENT INVENTION

The present invention relates to a thermoelectric cooling device and a thermoelectric semiconductor ceramic composition, and more particularly to a composition which is low in toxicity and has excellent characteristics.

BACKGROUND OF THE INVENTION

There is recently a growing demand for electronic components for use in thermoelectric cooling. Many of these components make use of the Peltier effect. However, this requires the use of chlorofluorocarbons which adversely effects the earths atmosphere. These compound are also regulated which impacts the requirements for local cooling or dehumidifying of electronic appliances and others in small-sized cooling devices.

Among the electronic components which are used for thermoelectric cooling, those using Bi-Te single-crystalline or polycrystalline solidified matter as a thermoelectric semiconductor substance are known. The thermoelectric semiconductor element is manufactered by electric series bonding of an n-type element and a p-type element, and in the Bi-Te compound element, Se is added to the n-type conductive element in order to adjust the characteristics.

The toxicity of Se used as additive to these elements is high, and the Bi-Te composition itself as the main ingredient is expensive. Accordingly, the range of use of the element has been limited.

The performance of a thermoelectric semiconductor device for thermoelectric cooling is expressed as the performance index $Z = s \times s \times \sigma/k (s^2\sigma/k)$, with the Seebeck coefficient as s, the electric conductivity as $\sigma$, and the thermal conductivity as k. The larger the value of Z in the temperature range around the room temperature, the greater the absorption heat per unit power consumption in thermoelectric cooling or the temperature difference from the cooling side.

As the technology relating to the invention, the thermoelectric characteristic of strontium titanate is described beginning at page A44 of Physical Review Vol. 134, 2A (1964). Barium titanatte is described begining at page 358 and after in Physical Review No. 157, 2 (1967).

The idea of using a copper oxide semiconductor for thermoelectric cooling is disclosed begining at page 111 of Materials Science and Engineering Vol. B7 (1990).

In the Japanese Laid-open Patent HEI. 1-231383, barium titanate semiconductor materials are disclosed as the materials suited to application of the Seebeck thermoelectromotive force in a heat sensor.

Aside from these, various semiconductor materials have been studied, but, except for Bi-Te compounds, no practical materials have been known hitherto for use in thermoelectric cooling.

SUMMARY OF THE INVENTION

In the light of the above problems, it is hence a primary object of the invention to present a thermoelectric cooling device using a semiconductor substance which is high in safety, inexpensive, and excellent in performance, having an n-type semiconductor, and a thermoelectric semiconductor ceramic composition for use therein.

To achieve the above object, the thermoelectric cooling device comprising at least two separate electrodes, an n-type semiconductor to a p-type semiconductor mounted on the two separate electrodes, and a bridge electrode for coupling the n-type semiconductor and p-type semiconductor and for generating absorption heat in the bridge electrode when a current flows from the n-type semiconductor to the p-type semiconductor, wherein the n-type semiconductor is an oxide semiconductor mainly composed of a complex oxide containing strontium and titanium, and possessing an oxygen deficiency showing a weight increase by high temperature oxidation in oxygen.

It is preferable in this invention that the n-type semiconductor is a complex oxide comprising at least one element selected from group A consisting of strontium, barium, calcium, potassium, sodium, lithium, cesium, rubidium, scandium, yttrium and lanthanide, and titanium or at least one element selected from group B consisting of titanium, zirconium, hafnium, tin, niobium, tantalum, tungsten, molybdenum, manganese, iron, cobalt, nickel, copper, zinc, indium, magnesium and antimony, and possessing an oxygen deficiency in a range of $0.06 \leq e \leq 0.55$ where e is the wt. % oxygen deficiency after complete high temperature oxidation.

It is preferable in this invention that the surface of the n-type semiconductor contacting the electrode is electroplated.

Another object of the invention is provide a thermoelectric cooling device comprising at least two separate electrodes, an n-type semiconductor and a p-type semiconductor mounted on the two separate electrodes, and a bridge electrode for coupling the n-type semiconductor to p-type semiconductor and for generating absorption heat in the bridge electrode when a current flows from the n-type semiconductor to the p-type semiconductor, wherein an oxide semiconductor possessing a porous structure of 30% or more porosity in which particles of a complex oxide comprising strontium and titanium are sintered together with the n-type semiconductor.

It is preferable in this invention that the n-type semiconductor comprises a complex oxide of strontium and titanium, and possesses an oxygen deficiency, in which the molar ratio of Ti or Sr is in a range of $1.005 \leq a \leq 1.120$ where a is the molar of Ti to Sr in the complex oxide, and oxigen deficiency after complete high temperature oxidation is in a range of $0.06 \leq b \leq 0.55$ where b is the wt. %.

It is preferable in this invention that the n-type semiconductor comprises a complex oxide comprising strontium, barium and titanium, and possesses an oxygen deficiency in a range of $0.45 \leq c < 1.00$, $1.005 \leq d \leq 1.120$ where c is the molar ratio of Sr to the total molar number of Sr and Ba in the complex oxide composition, and d is the molar ratio of titanium to the total molar number of Sr and Ba, and in a range of $0.06 \leq e \leq 0.55$ where e is the wt. % oxygen deficiency after complete high temperature oxidation.

It is preferable in this invention that the surface of the n-type semiconductor contacting the electrode is electroplated.

As the composition of the thermoelectric cooling device, a complex oxide composed of strontium and titanium is used as the main ingredient, and an oxide semiconductor possessing oxygen deficiency is used in the n-type semiconductor. As the thermoelectric semiconductor ceramic composition suited to such applications, a composition of a complex oxide mainly composed of strontium and titanium in a specific composition range and possessing oxygen deficiency is used.

According to the invention, the thermoelectric cooling device using an oxide semiconductor mainly composed of a complex oxide comprising strontium and titanium, in an n-type semiconductor which possesses oxygen deficiency, has a cooling characteristic equally comparable with that of the device using a Bi-Te compound. Moreover, since it does not contain Se or other harmful metals, and it can be manufactured by the conventional ceramic process technology, the manufacturing cost can be reduced, which is useful industrially.

By the composition of the invention, the toxicity of the n-type semiconductor, which was a serious problem, is lowered, and a thermoelectric semiconductor element which is inexpensive and excellent in performance is obtained.

DETAILED DESCRIPTION OF THE INVENTION

Figure 1:
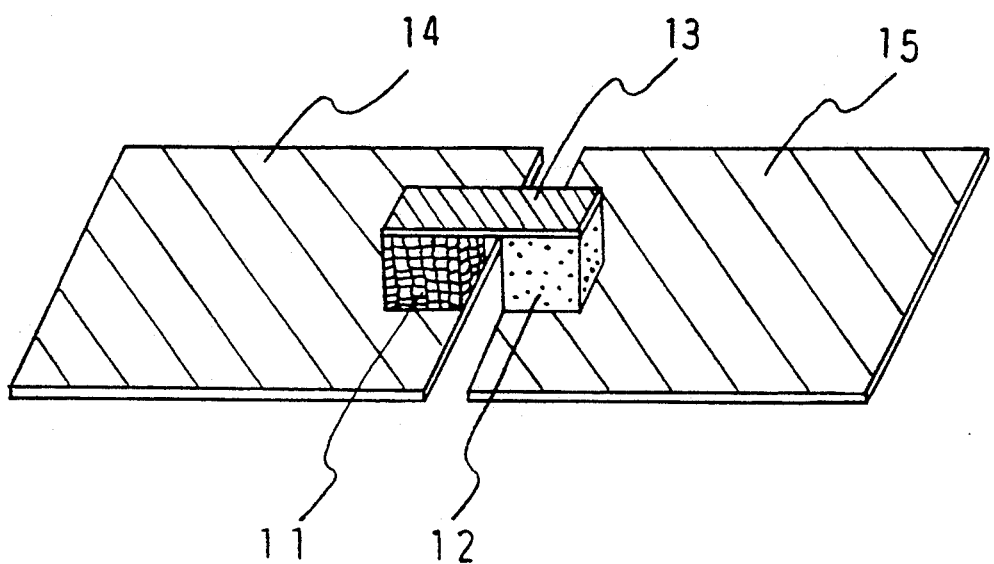
FIG. 1 is a schematic diagram of a thermoelectric semiconductor element in one embodiment of the invention.

Referring now to the drawings, a thermoelectric cooling device in one embodiment of the invention is described in detail below.

The surface of each semiconductor element was polished and processed into a cubic sample of 4 mm on one side, and the top and bottom ends were electroplated with nickel to a thickness of about 0.7 $\mu$m. Then, at an element gap of 2 mm as shown in FIG. 1, a bridge metal copper plate 13 of 0.7 mm in thickness was soldered to the top end. An n-type element 11 and a p-type element 12 were electrically coupled, and base metal copper plates 14, 15 of 2 mm at a thickness of 20 mm square were soldered to the bottom end, thereby fabricating a single pair of thermoelectric elements.

The base metal copper plates 14, 15 at the bottom end of each element were respectively fixed to metal copper blocks of 150 mm$^3$, which were electrically isolated from each other with screws. Through these metal copper blocks, the n-type element was electrically coupled to a DC power supply positive pole, and the p-type element to the DC power supply negative pole.

These elements were put in a vacuum container, and the inside was deaerated to 1 Pa, and DC current was applied. The temperature of the bridge metal copper plate 13 at the junction of the p-type element and n-type element was measured by a thermocouple. Referring to FIG. 1, the Peltier cooling effect takes place as follows: when the current flows from the base electrode 14 into the n-type semiconductor 11, heat is generated. When the current flows from the n-type semiconductor 11 into the bridge electrode 13 and from the bridge electrode 13 into the p-type semiconductor 12, heat is absorbed at the interface of bridge electrode 13 and n-type, p-type semiconductor. That is, the bridge electrode 13 is the cooling part. Furthermore, heat is generated between the p-type semiconductor 12 and base electrode 15.

Some of the preferred embodiments of the invention are described in detail below.

EXAMPLE 1

The compositions listed in Table 1 were evaluated for the thermoelectric cooling device combining an n-type semiconductor element and a p-type semiconductor element.

TABLE 1

| No. | n-type semiconductor element | Oxygen deficiency | n-type semiconductor element |
|---|---|---|---|
| 1 | $SrTiO_3$ sinter (in air) Reduction treatment in sponge titanium | 0.18 wt. % | $(BiSb)_2Te_3$ |
| 2 | $Sr_{0.97}La_{0.02}TiO_3$ Reducing atmosphere sinter Reduction treatment in titanium metal powder | 0.12 wt. % | $Bi_2Te_3$ |
| 3 | $SrTi_{0.99}Nb_{0.01}O_3$ Reducing atmosphere sinter Reduction treatment in sponge titanium | 0.14 wt. % | $Bi_2Te_3$ |
| 4* | $SrTi_{0.99}Nb_{0.01}O_3$ Sinter in air | 0.00 wt. % | $Bi_2Te_3$ |
| 5* | $Bi_2(Te_{2.4}Se_{0.6})$ | — | $Bi_2Te_3$ |

[*Comparison examples out of scope of the invention.]

The n-type semiconductor element of sample No. 1 was prepared by reduction treatment, starting from sintering in air. The element had a molar ratio of Sr to Ti of 1:1, a cubic shape of about 6 mm on one side, a relative density of about 95%, and a fine structure with a mean particle size of about 5 $\mu$m.

For reduction treatment, an alumina ceramic container was filled with sponge titanium metal, packed with the sinter sample, and heated in an electric oven in an argon atmosphere at 1450° C. for 16 hours.

To determine the oxygen deficiency of the sample, the ceramic portion of the measured sample was ground to a particle size of about 100 $\mu$m, and heated in 1500° C. oxygen. The weight change was measured, and oxygen deficiency was calculated when the weight increase stopped during heating.

In this sample, when the total treatment time in 1500° C. atmosphere reached 28 hours, the weight increase was stopped, and the re-oxidation was completely terminated.

The N-type semiconductor elements of sample Nos. 2 and 3 were prepared by reduction treatment, starting from a sinter by baking the captioned compositions in nitrogen containing 3% hydrogen, possessing a cubic shape of about 6 mm on one side, with a relative density of about 95%, and a fine structure with a mean particle size of about 2 $\mu$m.

For reduction treatment, an alumina ceramic container was filled with a titanium metal powder of about 100 mesh pass and the sintered sample, and heated in an electric furnace in an argon atmosphere at 1400° C. for 8 hours.

The oxygen deficiency of the sample was measured in the same manner as in sample No. 1.

In all samples, when the total treatment time in 1500° C. oxygen reached 12 hours, the weight increase stopped, and the reoxidation was completely terminated.

The n-type semiconductor element of sample No. 4 was a sintered by baking the captioned composition in air. The element was in a cubic shape of about 6 mm in one side, having a relative density of about 95%, and a fine structure with a mean particle size of about 2 $\mu$m, which was changed to a blue color indicative of a semiconductor state.

The oxygen deficiency of the sample could not be detected although measured in the same manner as in sample No. 1.

The n-type semiconductor element of sample No. 5 was a monocrystalline sample of $Bi_2$ ($Te_{2.4}Se_{0.6}$) conventionally used in thermoelectric cooling.

The p-type semiconductor elements of the samples were Bi-Te monocrystals in the captioned composition hitherto used in thermoelectric cooling.

From these n-type semiconductor substances and p-type semiconductor substances, a single pair of thermoelectric elements was fabricated as in FIG. 1. The minimum temperature reached at the np junction was measured in the same manner.

The current to be applied was tested at 0.5 A increments, and the current at which the temperature hit the bottom was determined.

Table 2 shows the DC value, lapse of time, and temperature reached when the temperature of the metal copper plate junction of each sample reached the lowest point.

TABLE 2

| No. | DC value | Lapse of time | Temperature reached |
|-----|----------|---------------|---------------------|
| 1   | 2.0 A    | 6 min 00 sec  | −18.6° C.           |
| 2   | 1.5 A    | 8 min 20 sec  | −9.2° C.            |
| 3   | 1.5 A    | 4 min 45 sec  | −10.6° C.           |
| 4*  | 1.5 A    | 2 min 25 sec  | 3.6° C.             |
| 5*  | 2.0 A    | 4 min 20 sec  | −23.3° C.           |

[*Comparison examples out of scope of the invention.]

As is clear from the foregoing embodiment, the thermoelectric cooling device using an oxide semiconductor was mainly composed of a complex oxide comprising strontium and titanium, in the n-type semiconductor type, which possesses oxygen deficiency, and had a cooling characteristic equally comparable with that of the device using Bi-Te compound in the n-type element part. Since the device does not contain Se or other harmful metals, and can be manufactured using existing ceramic process technology, the manufacturing cost can be reduced, which is useful industrially.

On the other hand, the n-type semiconductor element made semiconductive by valence control is not lowered in resistivity, and Joule's heat generation is large, which is not preferable for thermoelectric cooling device.

EXAMPLE 2

As the starting material of the n-type semiconductor substance, a composition mainly composed of a complex oxide comprising Sr and Ti was used, and $Bi_2Te_3$ was used as the p-type semiconductor substance.

The n-type semiconductor substance was prepared by reduction treatment, starting from sintering the composition in 1500° C. air for 48 hours. The substance had a cubic shape of about 6 mm on one side, a relative density of about 94 to 98%, and a fine structure with a mean particle size of about 1.4 to 5 μm.

For reduction treatment, an aluminum ceramic container was filled with titanium metal powder of about 100 mesh pass, packed with the sinter sample, and heated in an electric oven in an argon atmosphere at 1400° C. for 8 hours.

Table 3 shows the molar ratio of the component oxide mixture of the n-type semiconductor substance, and the oxygen deficiency in wt. % after reduction treatment.

After reduction treatment the sample was polished on the surface and was processed into a cube of 4 mm on one side.

TABLE 3

| No. | Composition | Oxygen deficiency |
|-----|-------------|-------------------|
| 6   | SrO; 0.98, $TiO_2$; 1.0 | 0.23 wt. % |
| 7   | SrO; 0.7, BaO; 0.3, $TiO_2$; 1.0 | 0.16 wt. % |
| 8   | SrO; 0.9, CaO; 0.08, $TiO_2$; 1.0 | 0.31 wt. % |
| 9   | SrO; 0.97, $Sm_2O_3$; 0.01, $TiO_2$; 1.0 | 0.48 wt. % |
| 10  | SrO; 0.95, $K_2O$; 0.025, $TiO_2$; 1.0 | 0.26 wt. % |
| 11  | SrO; 0.99, $Na_2O$; 0.005, $ZrO_2$; 0.10 | 0.16 wt. % |
| 12  | SrO; 0.97, $Y_2O_3$; 0.01, $TiO_2$; 1.0 | 0.55 wt. % |
| 13  | SrO; 0.97, $Sc_2O_3$; 0.01, $TiO_2$; 1.0 | 0.48 wt. % |
| 14  | SrO; 0.99, $Rb_2O$; 0.005, $ZrO_2$; 0.10 | 0.16 wt. % |
| 15  | SrO; 0.98, $Li_2O$; 0.005, $TiO_2$; 1.0 | 0.26 wt. % |
| 16  | SrO; 0.99, $CeO_2$; 0.005, $TiO_2$; 0.99 | 0.06 wt. % |
| 17  | SrO; 0.99, $TiO_2$; 0.99, $Nb_2O_5$; 0.005 | 0.48 wt. % |
| 18  | SrO; 0.99, $TiO_2$; 0.99, $Ta_2O_5$; 0.005 | 0.42 wt. % |
| 19  | SrO; 0.99, $TiO_2$; 0.99, $HfO_2$; 0.01 | 0.12 wt. % |
| 20  | SrO; 0.9, BaO; 0.1, $TiO_2$; 0.99, $SnO_2$; 0.01 | 0.19 wt. % |
| 21  | SrO; 1.0, $TiO_2$; 0.94, CoO; 0.02, $Nb_2O_5$; 0.02 | 0.06 wt. % |
| 22  | SrO; 1.0, $TiO_2$; 0.94, NiO; 0.02, $Nb_2O_5$; 0.02 | 0.38 wt. % |
| 23  | SrO; 1.0, $TiO_2$; 0.94, CuO; 0.02, $Ta_2O_5$; 0.02 | 0.21 wt. % |
| 24  | SrO; 1.0, $TiO_2$; 0.94, ZnO; 0.02, $Sb_2O_5$; 0.02 | 0.36 wt. % |
| 25  | SrO; 1.0, $TiO_2$; 0.94, MnO; 0.03, $WO_3$; 0.03 | 0.08 wt. % |
| 26  | SrO; 1.0, $TiO_2$; 0.94, FeO; 0.03, $WO_3$; 0.03 | 0.08 wt. % |
| 27  | SrO; 0.98, $TiO_2$; 0.99, MoO; 0.01 | 0.48 wt. % |
| 28  | SrO; 0.98, $TiO_2$; 0.99, $In_2O_3$; 0.005 | 0.52 wt. % |
| 29  | SrO; 0.8, Ba; 0.02, $TiO_2$; 0.7, MgO; 0.1, $Ta_2O_5$; 0.1 | 0.09 wt. % |
| 30* | $Bi_2Te_3$ sinter | — |

[*Comparison example out of scope of the invention.]

The p-type semiconductor substance was a polycrystalline solidified compound in the composition of $Bi_2Te_3$ in a 4 mm cube. This element had a Seebeck coefficient of 200 μV/deg., an electric conductivity of 740ohm-cm, a thermal conductivity of 0.018 W/cm-deg., and a performance index of 0.00164/deg.

From these n-type semiconductor substances and p-type semiconductor substances, a single pair of thermoelectric elements was fabricated as in Example 1. The minimum temperature reached at the np junction was measured in the same manner.

As a comparison example, the hitherto used polycrystalline solidified sample of $Bi_2Te_3$ was used in the n-type semiconductor part.

This n-type element had a Seebeck coefficient of 147 μV/deg., an electric conductivity of 1420 /ohm-cm, a thermal conductivity of 0.021 W/cm-deg., and a performance index of 0.00148/deg.

The base metal copper plates at the bottom end of each element were fixed to metal copper blocks of 150 $mm^3$. The plates were electrically isolated with screws. Through these metal copper blocks, the n-type element was electrically coupled to a DC power supply positive pole and the p-type element to the DC power supply negative pole.

These elements were put in a vacuum container, and the inside was deaerated to 1 Pa. DC current was applied, and the temperature of the bridge metal copper plate at the junction of the p-type element and n-type element was measured by means of a thermocouple.

The applied current was tested at 0.5 A increments, and the current at which the temperature hit the bottom was determined.

Table 4 shows the current at which the lowest temperature at the junction of the fabricated single thermoelectric element was reached, lapse of time, and the lowest temperature reached.

TABLE 4

| No. | I (A) | Lapse of time | Temperature reached |
| --- | --- | --- | --- |
| 6 | 1.0 A | 4 min 20 sec | −14.8° C. |
| 7 | 1.0 A | 5 min 15 sec | −11.6° C. |
| 8 | 1.5 A | 3 min 20 sec | −9.9° C. |
| 9 | 2.0 A | 6 min 35 sec | −9.7° C. |
| 10 | 1.5 A | 8 min 15 sec | −12.2° C. |
| 11 | 2.0 A | 4 min 20 sec | −11.2° C. |
| 12 | 2.0 A | 3 min 50 sec | −9.2° C. |
| 13 | 1.5 A | 7 min 15 sec | −9.2° C. |
| 14 | 2.0 A | 6 min 55 sec | −10.6° C. |
| 15 | 2.0 A | 5 min 50 sec | −9.8° C. |
| 16 | 1.5 A | 5 min 10 sec | −10.2° C. |
| 17 | 1.0 A | 9 min 20 sec | −12.2° C. |
| 18 | 1.0 A | 5 min 05 sec | −8.9° C. |
| 19 | 1.5 A | 3 min 20 sec | −10.6° C. |
| 20 | 1.5 A | 3 min 05 sec | −12.2° C. |
| 21 | 2.0 A | 8 min 20 sec | −9.2° C. |
| 22 | 1.0 A | 6 min 05 sec | −8.8° C. |
| 23 | 1.5 A | 6 min 35 sec | −14.2° C. |
| 24 | 2.0 A | 3 min 50 sec | −10.6° C. |
| 25 | 1.5 A | 4 min 00 sec | −12.2° C. |
| 26 | 2.0 A | 2 min 55 sec | −14.1° C. |
| 27 | 1.5 A | 3 min 25 sec | −10.0° C. |
| 28 | 1.5 A | 5 min 10 sec | −11.5° C. |
| 29 | 2.0 A | 4 min 55 sec | −8.9° C. |
| 30* | 2.5 A | 3 min 00 sec | −16.8° C. |

[*Comparison example out of scope of the invention.]

In all measurements, the temperature of the metal copper block parts was 24° C.

As shown from the preceding embodiment, it was found that the thermoelectric cooling device comprising an n-type semiconductor element is a complex oxide comprising at least one element selected from group A consisting of strontium, barium, calcium, potassium, sodium, lithium, cesium, rubidium, scandium, yttrium and lanthanide, and titanium or at least one element selected from group B consisting of titanium, zirconium, hafnium, tin, niobium, tantalum, tungsten, molybdenum, manganese, iron, cobalt, nickel, copper, zinc, indium, magnesium and antimony, and possessing an oxygen deficiency in a range of $0.06 \leq e \leq 0.55$ where e is the wt. % oxygen deficiency after complete high temperature oxidation of the semiconductor device possesses, as compared with an element using a Bi-Te compound in the n-type element, a nearly equal cooling characteristic, does not contain Se and other harmful metals, and can be manufactured by existing ceramic process technology, so that the manufacturing cost may be lowered, which is useful industrially.

EXAMPLE 3

Using a complex oxide of strontium and titanium as the n-type oxide semiconductor ceramic material, a thermoelectric semiconductor element was fabricated.

Using $SrCO_3$ and $TiO_2$ as the starting materials for oxide semiconductor ceramic, a complex oxide powder was prepared using a conventional ceramic process.

This complex oxide powder was placed in 1200° C. air for 1 hour by mixing with 30 to 70 vol. % of an organic binder and a proper amount of water, and the organic binder was burned away.

The sample after burning away the organic binder was a porous specimen having a relative density of between 21% and 65%.

This sample was put in a ceramic capsule to be buried in sponge titanium particles, placed in a tubular oven, and was reduced at 1200° C. for 4 hours while passing 20% hydrogen-argon gas.

By the reduction treatment, the relative density of the sample was hardly changed.

The n-type semiconductor element of sample No. 35 as a comparison example was an oxide semiconductor of strontium titanate reduced in the same manner as in Example 1, after densely sintering to a relative density of 98% by using the material of sample No. 31.

The n-type semiconductor element of sample No. 36 was a monocrystalline sample of $Bi_2(Te_{2.4}Se_{0.6})$ hitherto used for thermoelectric cooling.

The p-type semiconductor elements of the samples were single crystals of Bi-Te compounds hitherto used for thermoelectric cooling.

The p-type semiconductor element was polished on the surface, and processed into a rectangular parallelopiped of 10 mm × 2 mm on the top and bottom, and 10 mm in height. The n-type element was processed into a cube of 10 mm on one side, and the top and bottom ends were electroplated with nickel to about 0.7 μm in thickness and at a gap of 2 mm as shown in FIG. 1. A metal copper plate of 0.7 mm in thickness was soldered to the top end, and the n-type and p-type elements were electrically coupled. A metal copper plate of 20 mm square and 2 mm in thickness was soldered to the bottom end, thereby fabricating a single pair of thermoelectric elements.

The metal copper plates at the bottom end of each element were fixed to metal copper blocks of 150 mm³ and electrically isolated with screws. Through these metal copper blocks the n-type element was electrically coupled to a DC power supply positive pole, and the p-type element to the DC power supply negative pole.

These elements were put in a vacuum container, and the inside was deaerated to 1 Pa. DC current was applied, and the temperature of the metal copper plate at the junction of the p-type element and n-type element was measured by a thermocouple.

The applied current was tested at 0.5 A increments, and the current at which the temperature hit the bottom was determined.

Table 5 shows the DC current for reaching the minimum temperature of the metal copper plate junction of each sample, together with the lapse of time and the minimum temperature reached.

TABLE 5

| No. | Composition of n-type semi-conductor | Porosity | I (A) | Lapse time | Temperature reached |
| --- | --- | --- | --- | --- | --- |
| 31 | SrTiO₃ porous | 65% | 2.5 A | 1 min 20 sec | −18.8° C. |
| 32 | SrTiO₃ porous | 44% | 2.5 A | 1 min 48 sec | −20.8° C. |
| 33 | SrTiO₃ porous | 30% | 2.0 A | 2 min 15 sec | −17.2° C. |
| 34 | SrTiO₃ porous | 21% | 2.5 A | 5 min 30 sec | −15.0° C. |
| 35 | SrTiO₃ sinter | 2% | 3.5 A | 5 min 20 sec | −15.2° C. |
| 36* | Bi—Te single crystal | 0% | 3.0 A | 5 min 10 sec | −21.3° C. |

[*Comparison example out of scope of the invention]

It is clear from Table 5 that the thermoelectric cooling device using an oxide semiconductor possessing a porous structure composed of a complex oxide comprising strontium and titanium, in the n-type semiconductor element, is capable of reaching a lower temperature, faster and in a shorter time, than the one using a dense semiconductor element at the cooling surface. The final temperature is equally comparable with that the one using a Bi-Te compound, and the improvement in cooling rate is significant especially when the porosity is 30% or more.

This thermoelectric cooling device does not contain Te, Se and other harmful metals, and the material cost is low. It is possible to manufacture using conventional ceramic process technology, and hence the manufacturing cost is reduced, which is very useful industrially.

EXAMPLE 4

As an n-type oxide semiconductor ceramic material, a complex oxide of strontium and titanium in specific composition ratio was used, and a thermoelectric semiconductor element was fabricated.

Using $SrCO_3$ and $TiO_2$ as the starting materials for the oxide semiconductor ceramic, a complex oxide powder was prepared by the conventional ceramic process.

This complex oxide powder was formed by mixing with 30 to 50 vol. % of an organic binder and a proper amount of water. The organic binder was burned away by baking in 1350° C. air for 1 hour.

The sample after burning away the organic binder was a porous specimen having a relative density of 40 to 50%.

This specimen was put in a ceramic capsule to be buried in sponge titanium particles, placed in a tubular oven, and reduced for 4 hours at 1200° C. while passing 20% hydrogen-argon gas.

By the reduction treatment, the relative density of the sample was hardly changed.

The oxygen deficiency of the sample was determined by pulverizing the ceramic portion of the sample after measurement to a particle size of about 100 μm, and heating in 1500° C. oxygen to determine the weight change. Oxygen deficiency was calculated when the weight increase stopped during heating.

The p-type semiconductor elements of the samples were single crystals of Bi-Te hitherto used for thermoelectric cooling.

The p-type semiconductor element was polished on the surface, processed into a rectangular parallelopiped of 10 mm × 2 mm on the top and bottom, and was 10 mm in height. The n-type element was processed into a cube of 10 mm on one side, and the top end and bottom ends were electroplated with nickel to about 0.7 μm in thickness, at a gap of 2 mm. A metal copper plate of 0.7 mm in thickness was soldered to the top end, and the n-type and p-type elements were electrically coupled. A metal copper plate of 20 mm square and 2 mm in thickness was soldered to the bottom end, thereby fabricating a single pair of thermoelectric elements.

The metal copper plates at the bottom end of each element were fixed to metal copper blocks of 150 $mm^3$ and were electrically isolated with screws. Through these metal copper blocks the n-type element was electrically coupled to a DC power supply positive pole, and the p-type element to the DC power supply negative pole.

These elements were put in a vacuum container, and the inside was deaerated to 1 Pa. DC current was applied, and the temperature of the metal copper plate at the junction of the p-type element and n-type element was measured by a thermocouple.

The applied current was tested at 0.5 A increments, and the current at which the temperature hit the bottom was determined.

Table 6 shows the molar ratio a of Sr to Ti in the n-type semiconductor element in each sample, the oxygen deficiency amount b in wt. %, the porosity v in vol. %, the DC current at which the minimum temperature of the metal copper plate junction was reached, the lapse of time, and the minimum temperature reached.

TABLE 6

| No. | a | b (wt. %) | v (vol. %) | DC current | Lapse of time | Temperature reached |
|---|---|---|---|---|---|---|
| 37 | 0.990 | 0.22 | 39.4 | 3.0 A | 1 min 02 sec | +3.2° C. |
| 38 | 0.990 | 0.48 | 42.9 | 3.0 A | 1 min 46 sec | −2.6 °C. |
| 39 | 1.005 | 0.16 | 45.8 | 3.0 A | 1 min 56 sec | −15.6° C. |
| 40 | 1.005 | 0.35 | 33.6 | 3.0 A | 1 min 24 sec | −10.8° C. |
| 41 | 1.005 | 0.79 | 52.6 | 2.0 A | 1 min 36 sec | −0.6° C. |
| 42 | 1.014 | 0.03 | 46.8 | 2.5 A | 1 min 16 sec | −3.1° C. |
| 43 | 1.014 | 0.06 | 41.1 | 3.0 A | 1 min 29 sec | −12.2° C. |
| 44 | 1.014 | 0.25 | 52.6 | 3.5 A | 0 min 52 sec | −14.3° C. |
| 45 | 1.025 | 0.03 | 35.7 | 2.0 A | 1 min 20 sec | +2.3° C. |
| 46 | 1.025 | 0.06 | 33.1 | 2.0 A | 1 min 30 sec | −8.6° C. |
| 47 | 1.025 | 0.22 | 36.9 | 2.0 A | 1 min 45 sec | −15.2° C. |
| 48 | 1.025 | 0.55 | 46.2 | 2.0 A | 2 min 06 sec | −12.5° C. |
| 49 | 1.025 | 0.75 | 40.3 | 2.5 A | 1 min 30 sec | −2.3° C. |
| 50 | 1.120 | 0.09 | 47.9 | 2.0 A | 1 min 26 sec | −12.1° C. |
| 51 | 1.120 | 0.16 | 46.3 | 2.5 A | 1 min 15 sec | −13.6° C. |
| 52 | 1.120 | 0.36 | 32.5 | 2.0 A | 2 min 03 sec | −15.8° C. |
| 53 | 1.125 | 0.22 | 33.9 | 1.5 A | 2 min 23 sec | −2.6° C. |
| 54* | Bi(TeSe) | — | | 6.0 A | 6 min 35 sec | −21.3° C. |

[*Comparison example out of scope of the invention]

As shown from the foregoing embodiment, the thermoelectric cooling device of which an n-type semiconductor element was mainly composed of a complex oxide comprising strontium and titanium, and possessed an oxygen deficiency in a range of $1.005 \leq a \leq 1.120$ where a is the molar ratio of Ti to Sr in the complex oxide composition, and in a range of $0.06 \leq b \leq 0.55$ where b is the value of the oxygen deficiency after complete high temperature oxidation of the element expressed in wt. % is, in particular when the semiconductor element is composed of a porous matter with a porosity of 30% or more, small in the loss of electric conduction between particles and small in the factor for disturbing the thermoelectric cooling effect by Joule's heat, and therefore especially the lowest temperature reached is nearly equal to that obtained by using the Bi-Te thermoelectric element, and the time to reach is shorter.

If the composition ratio or oxygen deficiency amount exceeds the specified range, although the time to reach the lowest temperature may be shortened by making use of the advantage of the porous structure, because of the loss of electric conduction between particles and the presence of many semiconductor substances low in characteristics in the heat conduction route, the generation of Joule's heat disturbing the thermoelectric cooling effect increases, and hence the minimum temperature reached is not affected.

EXAMPLE 5

As the n-type oxide semiconductor ceramic material, a complex oxide of strontium, barium and titanium in a specific composition ratio was used, and a thermoelectric semiconductor element was fabricated.

Using $SrCO_3$, $BaCO_3$ and $TiO_2$ as starting materials for an oxide semiconductor ceramic, the complex oxide powder was prepared using a conventional ceramic process. This complex oxide powder was formed by mixing with 30 to 50 vol. % of an organic binder and a proper amount of water. The organic binder was burned away by baking in 1400° C. air for 1 hour. The sample after burning away the organic binder was a porous specimen having a relative density of 40 to 50%.

This specimen was put in a ceramic capsule to be buried in sponge titanium particles, placed in a tubular oven, and reduced for 4 hours at 1250° C. while passing 20% hydrogen-argon gas.

By the reduction treatment, the relative density of the sample was hardly changed. The oxygen deficiency of the sample was determined by pulverizing the ceramic portion of the sample to a particle size of about 100 μm, heating in 1500° C. oxygen to determine the weight change. Oxygen deficiency was calculated when the weight increase stopped during heating.

Thereafter, a thermoelectric cooling device in the same composition as in Example 4 was fabricated and evaluated.

Table 7 shows the molar ratio c of Ba to the total molar number of Sr and Ba in the n-type semiconductor element in each sample, the molar ratio a of Ti to the total molar number of Sr and Ba, the oxygen deficiency amount b in wt. %, the porosity v in vol. %, the DC current when the minimum temperature of the metal copper plate junction was reached, lapse of time and the temperature reached.

comprising strontium, barium and titanium, and possessed an oxygen deficiency in a range of $0.45 \leq c < 1.00$, $1.005 \leq d \leq 1.120$ where c is the molar ratio of Sr to the total molar number of Sr and Ba in the complex oxide composition, and d is the molar ratio of titanium to the total molar number of Sr and Ba, and in a range of $0.06 \leq e \leq 0.55$ where e is the oxygen deficiency after complete high temperature oxidation of the element expressed in wt. % is, in particular when the semiconductor element is composed of a porous matter with a porosity of 30% or more, small in the loss of electric conduction between particles and small in the factor for disturbing the thermoelectric cooling effect by Joule's heat, and therefore especially the lowest temperature reached is nearly equal to that obtained by using the Bi-Te thermoelectric element, and the time to reached is shorter.

If the composition ratio or oxygen deficiency amount exceeds the specified range, although the time to reach the lowest temperature may be shortened by making use of the advantage of the porous structure, because of the loss of electric conduction between particles and the presence of many semiconductor substances low in characteristics in the heat conduction route, the generation of Joule's heat disturbing the thermoelectric cooling effect increases, and hence the minimum temperature reached is not affected.

With the thermoelectric semiconductor element of the invention, characteristics nearly equal to those of the conventional Bi-Te material are obtained, and the materials are free of the problem of toxicity, and it is possible to manufacture easily using a conventional ceramic process, and the cost is reduced comprehensively, among other features, and hence it is advantageous industrially.

As has been shown, the invention is greatly beneficial to industry.

The invention may be embodied in other specific forms without departing from the spirit or essential characteristics thereof. The present embodiment is to be considered in all respects as illustrative and not restrictive, the scope of the invention being indicated by the appended claims rather than by the foregoing description and all changes which come within the meaning and range of equivalency of the claims are intended to be embraced therein.

What is claimed is:

TABLE 7

| No. | c | a | b (wt. %) | v (vol. %) | DC current | Lapse of time | Temperature reached |
|---|---|---|---|---|---|---|---|
| 55 | 0.30 | 0.990 | 0.22 | 39.4 | 3.0 A | 1 min 02 sec | +3.2° C. |
| 56 | 0.30 | 0.990 | 0.48 | 43.7 | 2.5 A | 1 min 46 sec | −2.6 °C. |
| 57 | 0.45 | 1.025 | 0.03 | 41.6 | 2.5 A | 1 min 56 sec | −0.6° C. |
| 58 | 0.45 | 1.025 | 0.06 | 46.3 | 3.0 A | 1 min 24 sec | −10.8° C. |
| 59 | 0.45 | 1.025 | 0.92 | 46.9 | 2.0 A | 1 min 36 sec | −0.6° C. |
| 60 | 0.45 | 1.014 | 0.03 | 40.3 | 2.5 A | 1 min 16 sec | −3.1° C. |
| 61 | 0.70 | 0.990 | 0.06 | 46.3 | 3.0 A | 1 min 29 sec | −12.2° C. |
| 62 | 0.70 | 1.025 | 0.25 | 46.9 | 3.5 A | 0 min 52 sec | −14.3° C. |
| 63 | 0.70 | 1.025 | 0.03 | 39.7 | 2.0 A | 1 min 20 sec | +2.3° C. |
| 64 | 0.70 | 1.025 | 0.06 | 33.1 | 1.5 A | 1 min 30 sec | −8.6° C. |
| 65 | 0.70 | 1.120 | 0.22 | 31.6 | 2.0 A | 1 min 45 sec | −15.2° C. |
| 66 | 0.70 | 1.120 | 0.55 | 33.9 | 2.5 A | 2 min 06 sec | −12.5° C. |
| 67 | 0.70 | 1.120 | 0.75 | 39.8 | 2.0 A | 1 min 30 sec | −2.3° C. |
| 68 | 0.70 | 1.150 | 0.09 | 50.6 | 1.5 A | 1 min 26 sec | −12.1° C. |
| 69 | 0.90 | 1.025 | 0.25 | 42.9 | 1.5 A | 1 min 15 sec | −13.1° C. |
| 70 | 0.90 | 1.025 | 0.50 | 39.8 | 2.5 A | 2 min 03 sec | −12.7° C. |
| 71 | 0.90 | 1.025 | 0.89 | 30.6 | 1.5 A | 2 min 23 sec | −0.6° C. |
| 54* | Bi(TeSe) | | | — | 6.0 A | 6 min 35 sec | −21.3° C. |

[*Comparison example out of scope of the invention]

As clear from the foregoing embodiment, the thermoelectric cooling device of which an n-type semiconductor element was mainly composed of a complex oxide 1. A thermoelectric cooling device comprising two separate electrodes, an n-type semiconductor and a p-type semiconductor mounted on the two separate electrodes, and a bridge electrode for coupling the n-type semiconductor and p-type semiconductor and for generating absorption heat in the bridge electrode when a current flows from the n-type semiconductor to the p-type semiconductor, wherein the n-type semiconductor is an oxide semiconductor comprising mainly a complex oxide containing strontium and titanium, and the n-type semiconductor possesses an oxygen deficiency in a range of $0.06 \leq e \leq 0.55$, wherein e is the wt. % of oxygen deficiency after oxidation.

2. The thermoelectric cooling device according to claim 1, wherein the n-type semiconductor is a complex oxide comprising strontium and titanium and at least one element selected from the group consisting of barium, calcium, potassium, sodium, lithium, cesium, rubidium, scandium, yttrium, lanthanide, zirconium, hafnium, tin, niobium, tantalum, tungsten, molybdenum, manganese, iron, cobalt, nickel, copper, zinc, indium, magnesium and antimony.

3. The thermoelectric cooling device according to claim 1, wherein the surface of the n-type semiconductor contacting the electrode is electroplated.

4. A thermoelectric cooling device comprising two separate electrodes, an n-type semiconductor and a p-type semiconductor mounted on the two separate electrodes, and a bridge electrode for coupling the n-type semiconductor and p-type semiconductor and for generating absorption heat in the bridge electrode when a current flows from the n-type semiconductor to the p-type semiconductor, wherein the n-type semiconductor possesses a porous structure of 30% or more porosity in which oxide particles comprising strontium and titanium are sintered together in the n-type semiconductor element, further wherein the n-type semiconductor possesses an oxygen deficiency in a range of $0.06 \leq e \leq 0.55$, wherein e is the wt. % oxygen deficiency after oxidation.

5. The thermoelectric cooling device according to claim 4, wherein the n-type semiconductor comprises a complex oxide of strontium and titanium, and possesses an oxygen deficiency, in which the molar ratio of Ti to Sr is in a range of $1.005 \leq a \leq 1.120$ where a is the molar of Ti to Sr in the complex oxide, and oxigen deficiency after complete high temperature oxidation is in a range of $0.06 \leq b \leq 0.55$ where b is the wt. %.

6. The thermoelectric cooling device according to claim 4, wherein the n-type semiconductor comprises a complex oxide comprising strontium, barium and titanium, and possesses an oxygen deficiency in a range of $0.45 \leq c < 1.00$, $1.005 \leq d \leq 1.120$ where c is the molar ratio of Sr to the total molar number of Sr and Ba in the complex oxide composition, and d is the molar ratio of titanium to the total molar number of Sr and Ba, and in a range of $0.06 \leq e \leq 0.55$ where e is the wt. % oxygen deficiency after complete high temperature oxidation.

7. The thermoelectric cooling device according to claim 4, wherein the surface of the n-type semiconductor contacting the electrode is electroplated.

* * * * *